(12) United States Patent
Chidambarrao et al.

(10) Patent No.: US 7,037,770 B2
(45) Date of Patent: May 2, 2006

(54) METHOD OF MANUFACTURING STRAINED DISLOCATION-FREE CHANNELS FOR CMOS

(75) Inventors: Dureseti Chidambarrao, Weston, CT (US); Omer H. Dokumaci, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/687,608

(22) Filed: Oct. 20, 2003

(65) Prior Publication Data

US 2005/0085022 A1    Apr. 21, 2005

(51) Int. Cl.
*H01L 21/00* (2006.01)

(52) U.S. Cl. ............... 438/154; 438/199; 438/405; 438/700; 438/933

(58) Field of Classification Search .......... 438/39, 438/41, 42, 44, 46, 47, 93, 94, 211, 257, 299, 438/311–313, 318, 320, 335, 337, 339, 341, 438/353, 357, 359, 360, 364, 413, 424, 429, 438/430, 481, 154, 199, 405, 700, 933
See application file for complete search history.

(56) References Cited

U.S. PATENT DOCUMENTS

| | | | |
|---|---|---|---|
| 3,602,841 A | 8/1971 | McGroddy | |
| 3,836,999 A | * 9/1974 | Nishizawa | ............ 148/33 |
| 4,665,415 A | 5/1987 | Esaki et al. | |
| 4,719,155 A | * 1/1988 | Matsumoto | ............ 428/700 |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |
| 5,471,948 A | 12/1995 | Burroughes et al. | |

(Continued)

OTHER PUBLICATIONS

Stanley Wolf and Richard N. Tauber, Silicon Processing For The VLSI Era, 2000, Lattice Press, Second Edition, 256-257.*

(Continued)

*Primary Examiner*—Lynne A. Gurley
*Assistant Examiner*—Stanetta Isaac
(74) *Attorney, Agent, or Firm*—Joseph P. Abate, Esq.; Greenblum & Bernstein P.L.C.

(57) ABSTRACT

A semiconductor device and method of manufacturing a semiconductor device. The semiconductor device includes channels for a pFET and an nFET. An SiGe layer is grown in the channel of the nFET channel and a Si:C layer is grown in the pFET channel. The SiGe and Si:C layer match a lattice network of the underlying Si layer to create a stress component in an overlying grown epitaxial layer. In one implementation, this causes a compressive component in the pFET channel and a tensile component in the nFET channel. In a further implementation, the SiGe layer is grown in both the nFET and pFET channels. In this implementation, the stress level in the pFET channel should be greater than approximately 3 GPa.

23 Claims, 7 Drawing Sheets

U.S. PATENT DOCUMENTS

| | | | |
|---|---|---|---|
| 5,557,122 | A | 9/1996 | Shrivastava et al. |
| 5,561,302 | A | 10/1996 | Candelaria |
| 5,565,697 | A | 10/1996 | Asakawa et al. |
| 5,571,741 | A | 11/1996 | Leedy |
| 5,592,007 | A | 1/1997 | Leedy |
| 5,592,018 | A | 1/1997 | Leedy |
| 5,670,798 | A | 9/1997 | Schetzina |
| 5,679,965 | A | 10/1997 | Schetzina |
| 5,683,934 | A | 11/1997 | Candelaria |
| 5,840,593 | A | 11/1998 | Leedy |
| 5,861,651 | A | 1/1999 | Brasen et al. |
| 5,880,040 | A | 3/1999 | Sun et al. |
| 5,940,736 | A | 8/1999 | Brady et al. |
| 5,946,559 | A | 8/1999 | Leedy |
| 5,960,297 | A | 9/1999 | Saki |
| 5,989,978 | A | 11/1999 | Peidous |
| 6,008,126 | A | 12/1999 | Leedy |
| 6,025,280 | A | 2/2000 | Brady et al. |
| 6,046,464 | A | 4/2000 | Schetzina |
| 6,066,545 | A | 5/2000 | Doshi et al. |
| 6,090,684 | A | 7/2000 | Ishitsuka et al. |
| 6,107,143 | A | 8/2000 | Park et al. |
| 6,117,722 | A | 9/2000 | Wuu et al. |
| 6,133,071 | A | 10/2000 | Nagai |
| 6,165,383 | A | 12/2000 | Chou |
| 6,221,735 | B1 | 4/2001 | Manley et al. |
| 6,228,694 | B1 | 5/2001 | Doyle et al. |
| 6,246,095 | B1 | 6/2001 | Brady et al. |
| 6,255,169 | B1 | 7/2001 | Li et al. |
| 6,261,964 | B1 | 7/2001 | Wu et al. |
| 6,265,317 | B1 | 7/2001 | Chiu et al. |
| 6,274,444 | B1 | 8/2001 | Wang |
| 6,281,532 | B1 | 8/2001 | Doyle et al. |
| 6,284,623 | B1 | 9/2001 | Zhang et al. |
| 6,284,626 | B1 | 9/2001 | Kim |
| 6,319,794 | B1 | 11/2001 | Akatsu et al. |
| 6,361,885 | B1 | 3/2002 | Chou |
| 6,362,082 | B1 | 3/2002 | Doyle et al. |
| 6,368,931 | B1 | 4/2002 | Kuhn et al. |
| 6,399,970 | B1 * | 6/2002 | Kubo et al. .......... 257/194 |
| 6,403,486 | B1 | 6/2002 | Lou |
| 6,403,975 | B1 | 6/2002 | Brunner et al. |
| 6,406,973 | B1 | 6/2002 | Lee |
| 6,429,061 | B1 * | 8/2002 | Rim .......... 438/198 |
| 6,461,936 | B1 | 10/2002 | von Ehrenwall |
| 6,476,462 | B1 | 11/2002 | Shimizu et al. |
| 6,493,497 | B1 | 12/2002 | Ramdani et al. |
| 6,498,358 | B1 | 12/2002 | Lach et al. |
| 6,501,121 | B1 | 12/2002 | Yu et al. |
| 6,506,639 | B1 * | 1/2003 | Yu et al. .......... 438/197 |
| 6,506,652 | B1 | 1/2003 | Jan et al. |
| 6,509,587 | B1 * | 1/2003 | Sugiyama et al. .......... 257/192 |
| 6,509,618 | B1 | 1/2003 | Jan et al. |
| 6,521,964 | B1 | 2/2003 | Jan et al. |
| 6,531,369 | B1 | 3/2003 | Ozkan et al. |
| 6,531,740 | B1 | 3/2003 | Bosco et al. |
| 6,555,839 | B1 * | 4/2003 | Fitzgerald .......... 257/18 |
| 6,730,551 | B1 * | 5/2004 | Lee et al. .......... 438/191 |
| 6,831,292 | B1 | 12/2004 | Currie et al. |
| 2001/0009784 | A1 | 7/2001 | Ma et al. |
| 2002/0074598 | A1 | 6/2002 | Doyle et al. |
| 2002/0086472 | A1 | 7/2002 | Roberds et al. |
| 2002/0086497 | A1 | 7/2002 | Kwok |
| 2002/0090791 | A1 | 7/2002 | Doyle et al. |
| 2003/0032261 | A1 | 2/2003 | Yeh et al. |
| 2003/0040158 | A1 | 2/2003 | Saitoh |
| 2003/0057184 | A1 | 3/2003 | Yu et al. |
| 2003/0067035 | A1 | 4/2003 | Tews et al. |
| 2003/0075758 | A1 * | 4/2003 | Sundaresan et al. .......... 257/329 |

OTHER PUBLICATIONS

Kern Rim, et al., "Transconductance Enhancement in Deep Submicron Strained-Si $n$-MOSFETs", International Electron Devices Meeting, 26, 8, 1, IEEE, Sep. 1998.

Kern Rim, et al., "Characteristics and Device Design of Sub-100 nm Strained Si N- and PMOSFETs", 2002 Symposium On VLSI Technology Digest of Technical Papers, IEEE, pp. 98-99.

Gregory Scott, et al., "NMOS Drive Current Reduction Caused by Transistor Layout and Trench Isolation Induced Stress", International Electron Devices Meeting, 34.4.1, IEEE, Sep. 1999.

F. Ootsuka, et al., "A Highly Dense, High-Performance 130nm node CMOS Technology for Large Scale System-on-a-Chip Application", International Electron Devices Meeting, 23.5.1, IEEE, Apr. 2000.

Shinya Ito, et al., "Mechanical Stress Effect of Etch-Stop Nitride and its Impact on Deep Submicron Transistor Design", International Electron Devices Meeting, 10.7.1, IEEE, Apr. 2000.

A. Shimizu, et al., "Local Mechanical-Stress Control (LMC): A New Technique for CMOS-Performance Enhancement", International Electron Devices Meeting, IEEE, Mar. 2001.

K. Ota, et al., "Novel Locally Strained Channel Technique for high Performance 55nm CMOS", International Electron Devices Meeting, 2.2.1, IEEE, Feb. 2002.

* cited by examiner

METHOD OF MANUFACTURING STRAINED DISLOCATION-FREE CHANNELS FOR CMOS

BACKGROUND OF THE INVENTION

1. Field of the Invention

The invention generally relates to a semiconductor device and method of manufacture and, more particularly, to a semiconductor device and method of manufacture which imposes tensile and compressive stresses in the device during device fabrication.

2. Background Description

Mechanical stresses within a semiconductor device substrate can modulate device performance. That is, stresses within a semiconductor device are known to enhance semiconductor device characteristics. Thus, to improve the characteristics of a semiconductor device, tensile and/or compressive stresses are created in the channel of the n-type devices (e.g., NFETs) and/or p-type devices (e.g., PFETs). However, the same stress component, either tensile stress or compressive stress, discriminatively affects the characteristics of an n-type device and a p-type device.

In order to maximize the performance of both nFETs and pFETs within integrated circuit (IC) chips, the stress components should be engineered and applied differently for nFETs and pFETs. That is, because the type of stress which is beneficial for the performance of an nFET is generally disadvantageous for the performance of the pFET. More particularly, when a device is in tension (e.g., in the direction of current flow in a planar device), the performance characteristics of the nFET are enhanced while the performance characteristics of the pFET are diminished. To selectively create tensile stress in an nFET and compressive stress in a pFET, distinctive processes and different combinations of materials are used.

For example, a trench isolation structure has been proposed for forming the appropriate stresses in the nFETs and pFETs, respectively. When this method is used, the isolation region for the nFET device contains a first isolation material which applies a first type of mechanical stress on the nFET device in a longitudinal direction (e.g., parallel to the direction of current flow) and in a transverse direction (e.g., perpendicular to the direction of current flow). Further, a first isolation region and a second isolation region are provided for the pFET and each of the isolation regions of the pFET device applies a unique mechanical stress on the pFET device in the transverse and longitudinal directions.

Alternatively, liners on gate sidewalls have been proposed to selectively induce the appropriate stresses in the channels of the FET devices (see, Ootsuka et al., IEDM 2000, p.575, for example). By providing liners the appropriate stress is applied closer to the device than the stress applied as a result of the trench isolation fill technique.

While these methods do provide structures that have tensile stresses being applied to the nFET device and compressive stresses being applied along the longitudinal direction of the pFET device, they may require additional materials and/or more complex processing, and thus, resulting in higher cost. Further, the level of stress that can be applied in these situations is typically moderate (i.e., on the order of 100s of MPa). Thus, it is desired to provide more cost-effective and simplified methods for creating large tensile and compressive stresses in the channels nFETs and pFETs, respectively.

SUMMARY OF THE INVENTION

In a first aspect of the invention, a method is provided for manufacturing a semiconductor structure. The method includes forming a p-type field-effect-transistor (pFET) channel and a n-type field-effect-transistor (nFET) channel in a substrate. A first layer of material is provided within the pFET channel having a lattice constant different than the lattice constant of the substrate and a second layer of material is provided within the nFET channel having a lattice constant different than the lattice constant of the substrate. An epitaxial semiconductor layer is formed over the first layer of material in the pFET channel and the second layer of material in the nFET channel. The epitaxial semiconductor layer has substantially a same lattice constant as the substrate such that a stress component is created within the pFET channel and the nFET channel.

In another aspect of the invention, a method of manufacturing a semiconductor structure is provided. The method includes forming a pFET and an nFET channel in a substrate layer such as Si or silicon on insulator. A first layer of material is provided within the pFET channel having a lattice constant different than the lattice constant of the substrate layer and a second layer of material is provided within the nFET channel having a lattice constant different than the lattice constant of the substrate layer. An epitaxial semiconductor layer is formed over the first layer of material in the pFET channel and the second layer of material in the nFET channel. The epitaxial semiconductor layer has substantially a same lattice constant as the substrate layer thus creating a stress component opposite to that of the first layer of material within the pFET channel and the second layer of material within the nFET channel.

In still a further aspect of the invention, a semiconductor structure includes a pFET and nFET channel formed in a substrate such as, for example, a Si layer. A shallow trench isolation structure is formed in the Si layer and a first layer of material in the pFET channel having a lattice constant different than the lattice constant of the Si layer. A second layer of material in the nFET channel has a lattice constant different than the lattice constant of the Si layer. An epitaxial semiconductor layer formed over the first layer of material in the pFET channel and the second layer of material in the nFET channel has substantially a same lattice constant as the Si layer thus creating a desired stress component within the pFET channel and the nFET channel.

DETAILED DESCRIPTION OF EMBODIMENTS OF THE INVENTION

This invention is directed to a semiconductor device and method of manufacture which provides tensile stresses in the nFET channel and compressive stresses in the pFET channel of CMOS devices. In one embodiment, high tensile stresses may also be provided in the pFET channel to increase device performance. In one embodiment of the invention, channels are formed in the silicon layer in the area of the formation of the nFETs and pFETs. The channels are then filled with silicon based material having a naturally occurring lattice constant which does not match the lattice constant of the underlying silicon layer. By applying these materials, tensile and/or compressive forces result in an overlying epitaxial layer in the channels of the nFETs and pFETs, respectively. In one embodiment, the nFET and pFET channels can be formed simultaneously. By using the fabrication processes of the invention, improved device characteristics can be achieved, as well as higher yields and lower device defects. Also, lower manufacturing costs can be realized with the fabrication processes of the invention.

Figure 1A:
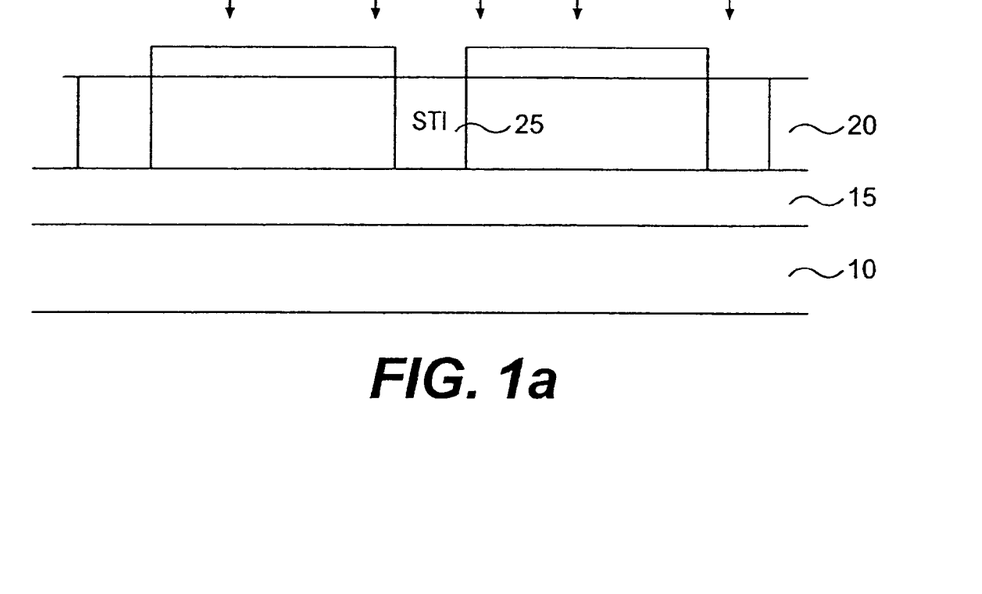
FIG. 1a through 1f represent a fabrication process to form a device in accordance with the invention.

FIG. 1a through 1f represent a fabrication process to form a device in accordance with the invention. In FIG. 1a, a substrate 10 such as, for example, silicon-on-insulator (SOI) or the like is provided. It includes a buried oxide layer 15 and a Si-on-insulator layer 20 (e.g., Si layer). The SOI wafer could be formed by either SIMOX or bonded techniques that are well known in the art. In one embodiment, the Si layer 20 is approximately 300 Å to 1500 Å; however, it should be well understood that variations in the height of the Si layer 20 are contemplated by the invention depending on the particular application.

Still referring to FIG. 1a, the Si layer 20 is then patterned to form shallow trench isolation features (STI) 25 using standard techniques of pad oxidation, pad nitride deposition, lithography based patterning, reactive ion etching (RIE) of the stack consisting of nitride, oxide, and silicon down to the buried oxide, edge oxidation, liner deposition, fill deposition, and chemical mechanical polish. The STI formation process is well known in the art. The pad nitride is then stripped.

Figure 1B:
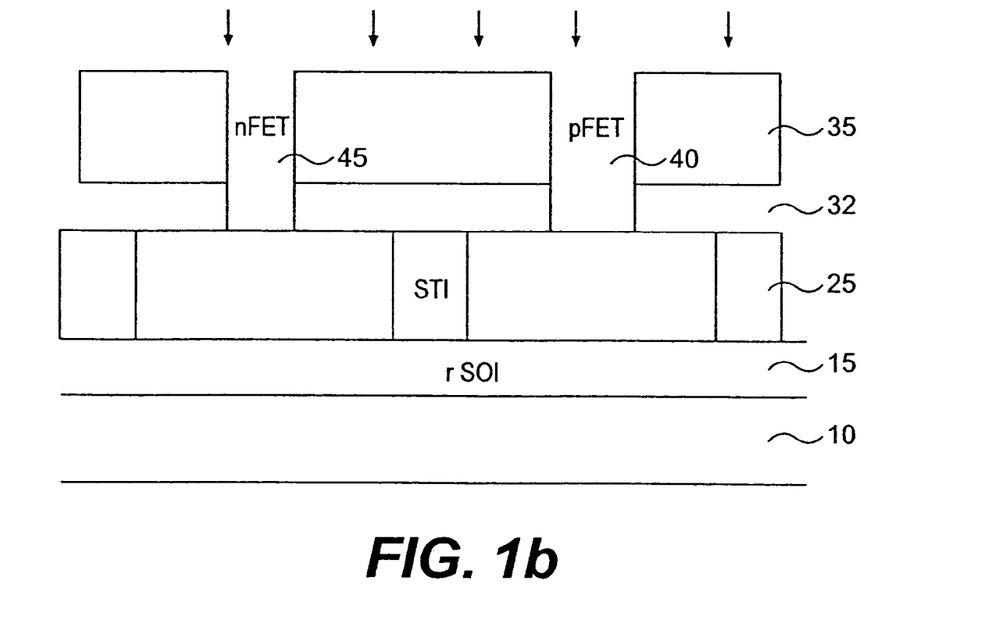
Figure 1C:
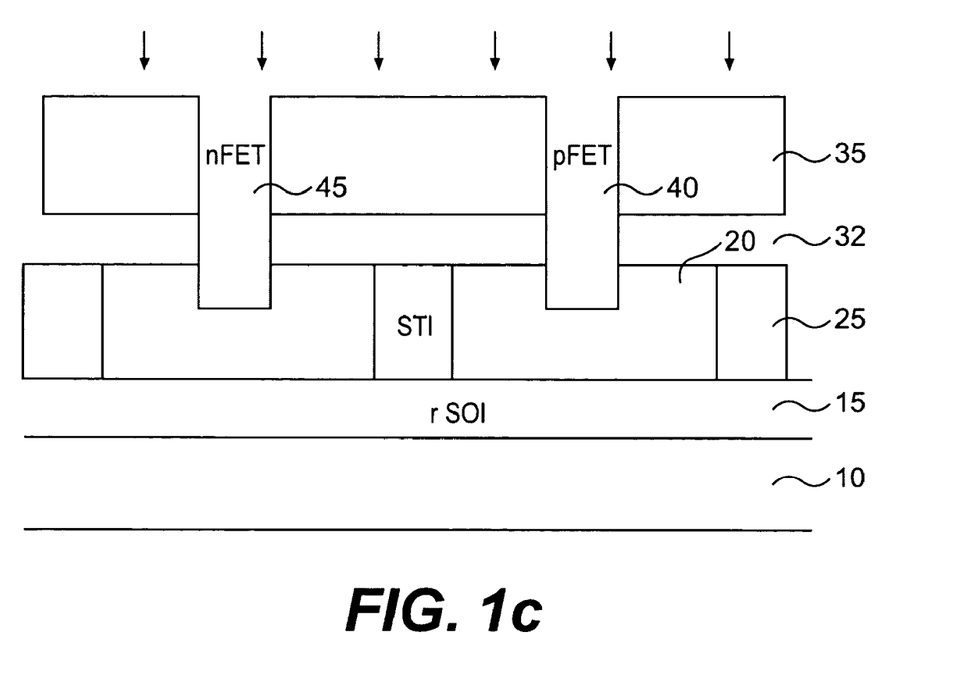

Now referring to FIG. 1b, an oxide layer 32 is deposited on the polished surface of the STI regions 25 and the Si layer 20. The height of this oxide layer 32 may vary and is, in one embodiment, approximately 200 Å. A photo resist layer 35, which can be any known photo resist material, is deposited on the oxide layer 32. After using known masking and lithographic patterning techniques, a reactive ion etching, for example, is then performed on the photo resist layer 35 and the oxide layer 32. The reactive ion etching, in this step, may be selective to the oxide layer. This begins the process of forming the pFET channels 40 and the nFET channels 45, simultaneously. After the oxide etch, the Si layer 20 is selectively etched using a reactive ion etch, as shown in FIG. 1c.

In an alternative step, the Si is first amorphized using a Ge implant at a typical dose of 2e14#/cm$^2$ to 1e15 #/cm$^2$ with an energy in the range of 10 keV to 100 keV depending on the depth of etches needed. This optional amorphization step may be used to improve the etch quality. In either fabrication, the channels 40 and 45 are formed in the Si layer 20 corresponding to a placement of the pFETs and nFETs, respectively. In one implementation, the channels 40 and 45 are etched to a depth of about 200 Å to 400 Å, in the Si layer 20. However, this depth may vary depending on the particular application used with the invention.

Figure 1D:
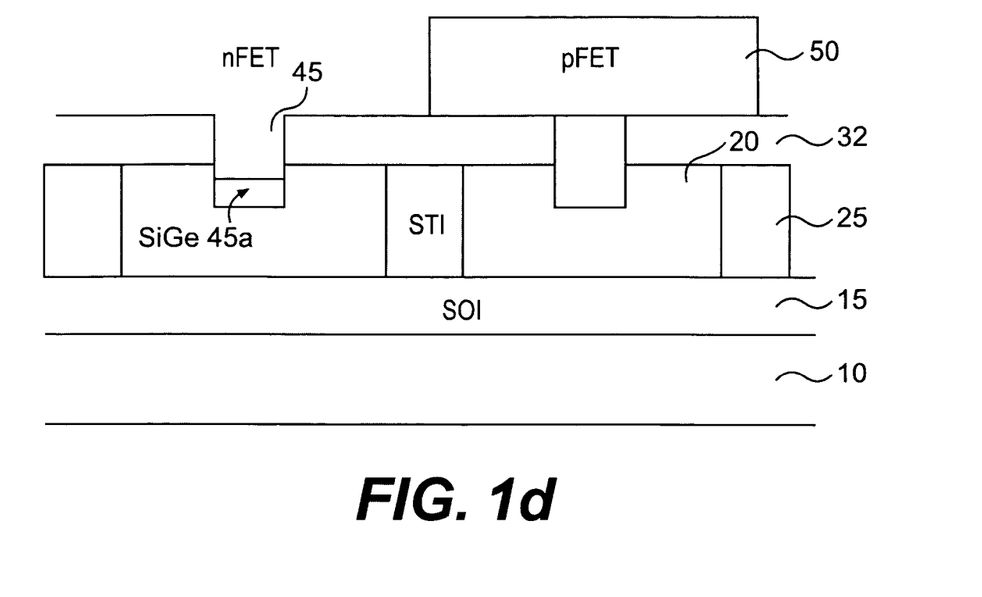

FIG. 1d is representative of further fabrication processes in accordance with the invention. In these fabrication processes, the photo resist material 35 is removed using any known processes. A hard mask 50 is patterned within the pFET channel 40 using any known lithographic process. In one embodiment, the hard mask is a Nitride material and is patterned over the oxide layer 32, proximate the pFET channel 40. A SiGe layer 45a is epitaxial grown in the nFET channel 45 to a thickness of about 100 Å to 300 Å, although other thicknesses are also contemplated by the invention.

Standing alone, the SiGe normally has a larger lattice constant than the Si layer 20. That is, the lattice constant of the SiGe material does not match the lattice constant of the Si layer 20. However, in the structure of the invention, due to the growth of the SiGe layer 45a within the nFET channel 45, the lattice structure of the SiGe layer 45a will tend to match the lattice structure of the underlying Si layer 20.

By virtue of the lattice matching of the SiGe 45a (which normally is larger) to the Si layer 20, this results in the SiGe layer 45a and the surrounding areas being under compression. The surrounding areas of the SiGe layer, though, will try to obtain an equilibrium state thus resulting in a tensile stress of an epitaxial Si layer formed on the SiGe layer 45a (as shown in FIG. 1f). In one embodiment, the Ge content of the SiGe layer 45a may be from 5% to 50% in ratio to the Si content.

Figure 1E:
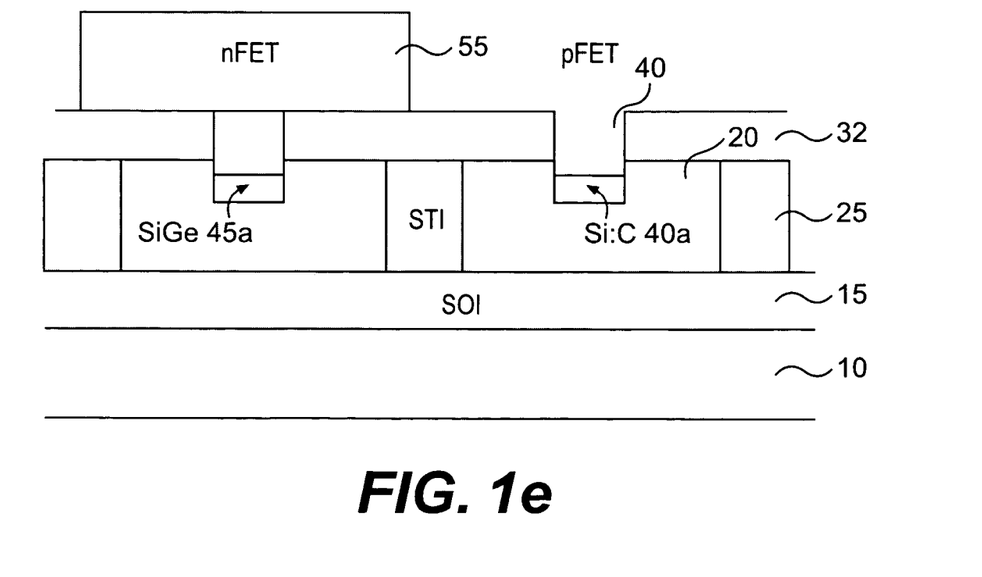
Figure 1F:
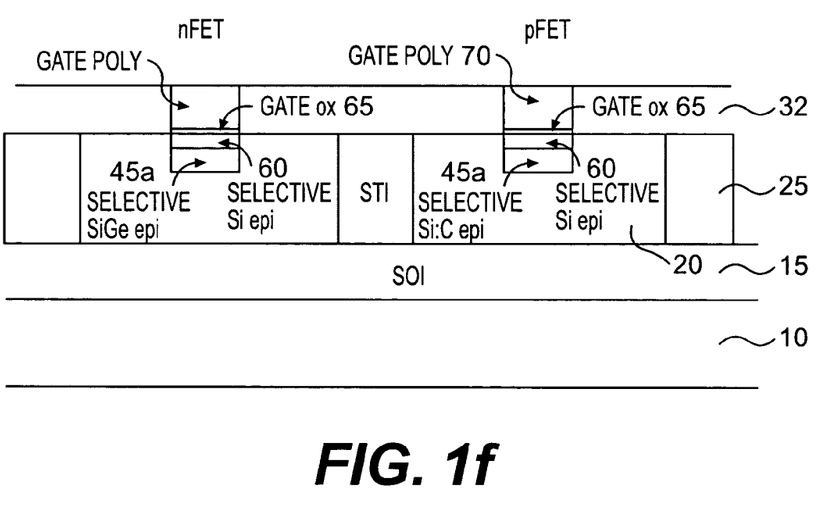

In FIG. 1e, the hard mask 50 is removed by any known process. A hard mark 55 is patterned within the nFET channel 45 using any known lithographic process. The hard mask 55 is also patterned over the oxide layer 32, proximate to the nFET channel 45 and over the thus grown SiGe layer 45a. Again, in one embodiment, the hard mask 55 is a Nitride material. A Si:C layer 40a is then epitaxial grown in the channel 40 of the pFET to a thickness of about 100 Å to 300 Å, although other thicknesses are also contemplated by the invention. It should be understood by those of ordinary skill in the art that the process steps of FIG. 1e may equally be performed prior to the process steps shown in FIG. 1d.

Standing alone, Si:C would normally have a smaller lattice constant than the Si layer 20. That is, the lattice constant of the Si:C material does not match the lattice constant of the Si layer 20. However, in the structure of the invention, due to the growth of the Si:C layer 40a within the pFET channel 40, the lattice structure of the Si:C layer 40a will tend to match the lattice structure of the underlying Si layer 20.

By virtue of the lattice matching of the Si:C 40a (which normally is smaller) to the Si layer 20, this results in the Si:C layer 40a and the surrounding areas being under a tensile stress. Similar to the occurrence with the SiGe layer, the surrounding areas of the Si:C layer 40a will try to obtain an equilibrium state thus resulting in a compressive stress of an epitaxial Si layer formed on the Si:C layer 40a. In one embodiment, the C content may be from 0% to 4% in ratio to the Si content.

FIG. 1f shows an intermediate structure. To obtain this structure, the hard mask 55 is removed, in a similar fashion to that described with reference to FIG. 1e. A Si epitaxial layer 60 is selectively grown over the Si:C and SiGe layers in channels of the pFETs and nFETs, respectively. In an embodiment, the Si epitaxial layer 60 equilibrates with the surrounding structure of SiGe 45a or Si:C 40a and the Si insulation layer 20 resulting in a tensile stress in the nFET channel 45 and a compressive stress in the pFET channel 40, as discussed above. It should be understood that by adjusting the concentrations of the Ge content in the SiGe layer, it is possible to adjust the tensile stress in the nFET channel 45. Similarly, by adjusting the concentrations of C in the Si:C layer, it is possible to then adjust the compressive stress in the pFET channel 40. This is due to the lattice constant of such materials.

Still referring to FIG. 1f, a sacrificial oxide layer 65 is then grown over the selectively grown epitaxial Si layer 60. Then the pFET is masked using standard photoresist-based lithographic techniques so that the nFET channel implants can be performed. After stripping the related photoresist (not shown in the FIG. 1f) the nFET is then masked (again using standard photoresist-based lithographic techniques) and the pFET channel implants are performed followed by another photoresist strip. Then, the sacrificial oxide layer 65 is stripped and the gate oxidation layer 70 is grown as shown in FIG. 1f. Then, the gate polysilicon 70 is formed in the pFET and nFET regions. The gate poly deposition and chemical mechanical polishing, well known to those of ordinary skill in the art, is performed to produce the structure shown in FIG. 1f.

After stripping the damascene oxide layer 32, standard CMOS processing may continue the process. For example, after the oxide layer 32 is stripped using any known process, standard spacer and ion implantation processes can be performed to form the extensions and source and drain regions of the pFETs and nFETs.

Figure 2A:
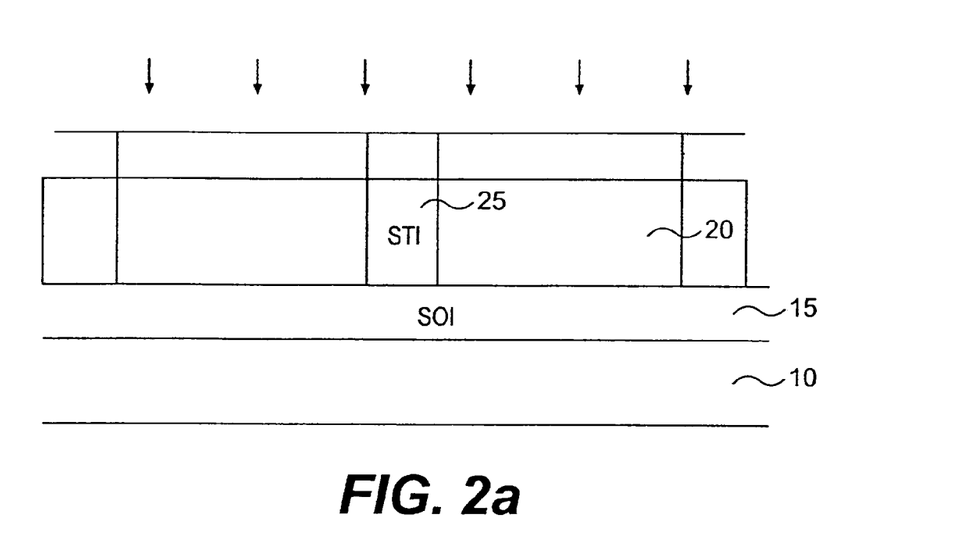
FIGS. 2a through 2d represent a fabrication process to form a device in accordance with the invention.

FIGS. 2a through 2d represent another fabrication process to form a device in accordance with the invention. In FIG. 2a, the substrate and STI are formed in the same way as that for FIG. 1a. In FIG. 2a, a substrate 10 such as, for example, silicon-on-insulator (SOI) or the like is provided. It includes a buried oxide layer 15 and a Si-on-insulator layer 20. The SOI wafer could be formed by either SIMOX or bonded techniques that are well known in the art. In one embodiment, the Si layer 20 is approximately 300 Å to 1500 Å; however, it should be well understood that variations in the height of the Si layer 20 are contemplated by the invention depending on the particular application.

Still referring to FIG. 2a, the Si layer 20 is then patterned to form shallow trench isolation features (STI) 25 using standard techniques of pad oxidation, pad nitride deposition, lithography based patterning, reactive ion etching (RIE) of the stack consisting of nitride, oxide, and silicon down to the buried oxide, edge oxidation, liner deposition, fill deposition, and chemical mechanical polish. The STI formation process is well known in the art. The pad nitride is then stripped.

Figure 2B:
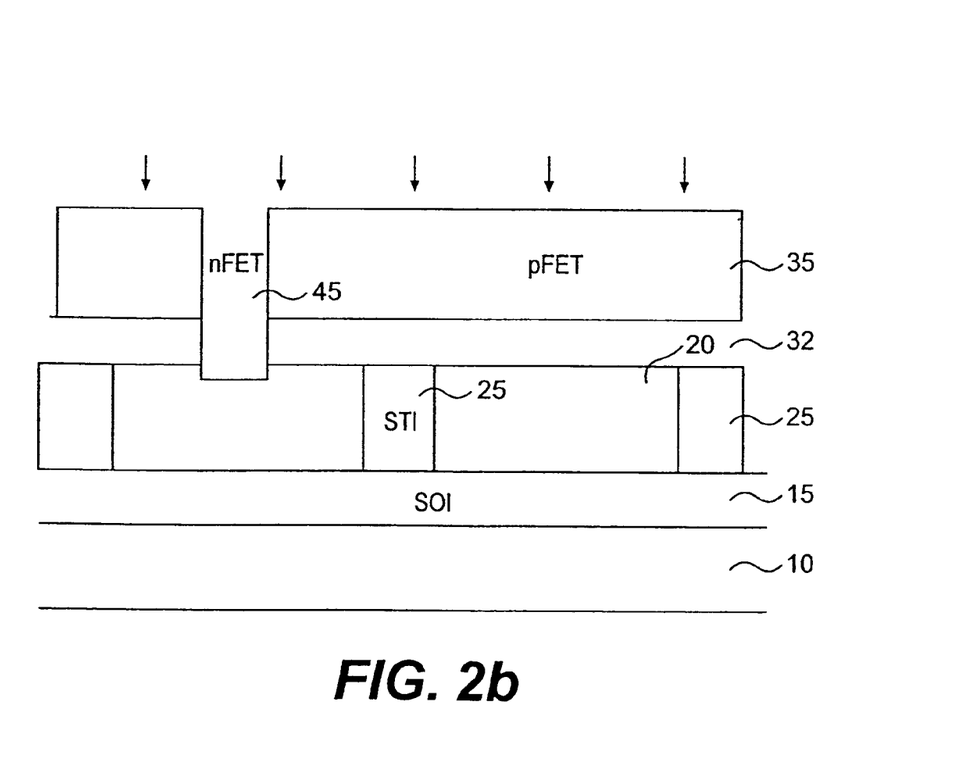

Now referring to FIG. 2b, an oxide layer 32 is deposited on the polished surface of the STI regions 25 and the Si layer 20. The height of this oxide layer 32 may vary and is, in one embodiment, approximately 200 Å. A photo resist layer 35, which can be any known photo resist material, is deposited on the oxide layer 32. After using known masking and lithographic patterning techniques, a reactive ion etching, for example, is then performed on the photo resist layer 35 and the oxide layer 32. The reactive ion etching, in this step, may be selective to the oxide layer. This begins the process of forming the nFET channels 45. After the oxide etch, the Si layer 20 is selectively etched using a reactive ion etch. An optional amorphous Si etch may be performed to improve the etch quality. In one implementation, the channel 45 is etched to a depth of about 200 Å to 400 Å in the Si insulation layer 20. However, this depth may vary depending on the particular application used with the invention.

In an alternative step, the Si is first amorphized using a Ge implant at a typical dose of 2e14#/cm$^2$ to 1e15 #/cm$^2$ with an energy in the range of 10 keV to 100 keV depending on the depth of etches needed. This optional amorphization step may be used to improve the etch quality. In either fabrication, the channels 40 and 45 are formed in the Si layer 20 corresponding to a placement of the pFETs and nFETs, respectively. In one implementation, the channels 40 and 45 are etched to a depth of about 200 Å to 400 Å, in the Si layer 20. However, this depth may vary depending on the particular application used with the invention.

Figure 2C:
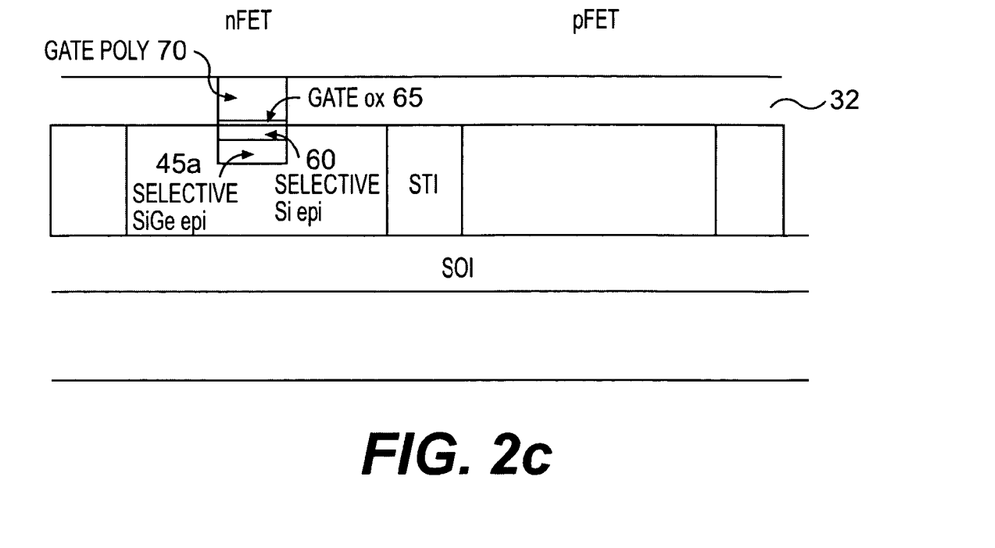

FIG. 2c is representative of further fabrication processes in accordance with the invention. In these fabrication processes, a SiGe layer 45a is grown in the channels 45 of the nFET to a height of about 100 Å to 300 Å, although other heights are also contemplated by the invention. In one embodiment, the Ge content of the SiGe may be from 0% to 50% in ratio to the Si content, preferably about 15%. Then, an epitaxial Si layer 60 is selectively grown over the SiGe layer 45a in the nFET channels 45. A sacrificial gate oxide layer 65 is then grown over the selectively grown Si layer 60. An nFET mask and well implant is then provided using any well known fabrication process. A gate oxide 65b is then formed in the nFET regions. A gate polysilicon 70b in then deposited followed by chemical mechanical polishing, well known to those of ordinary skill in the art, to produce the structure shown in FIG. 2c.

Figure 2D:
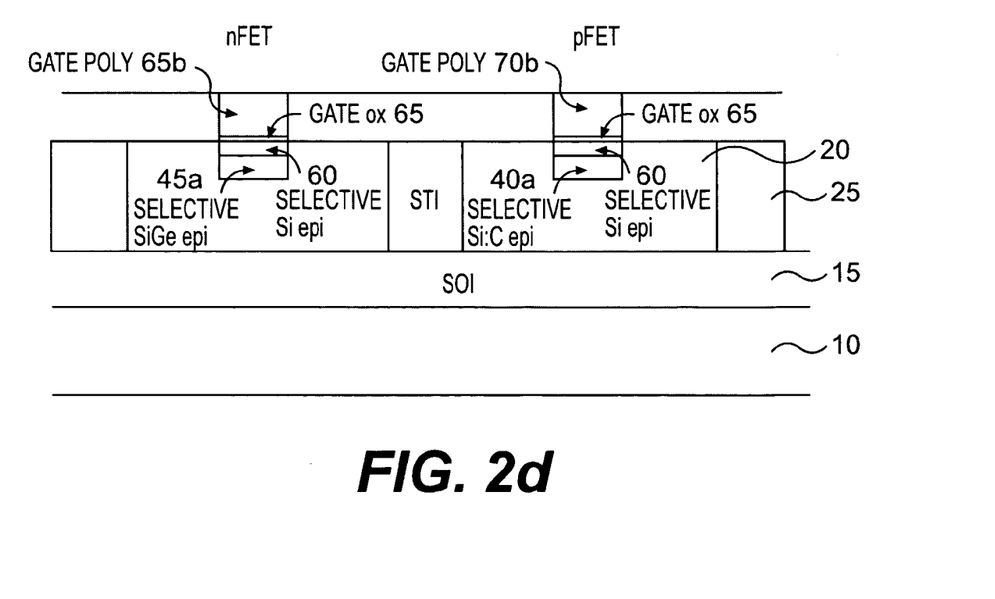

This same process can then be used to form the pFET of the device, which may equally be represented by FIGS. 2b and 2c. Instead of SiGe the pFET structure incorporates Si:C. The final product is shown in FIG. 2d which shows the pFET that incorporates selective Si:C gate oxide 65b and gate poly 70b. The oxide 32 is stripped and standard CMOS processing may be used to continue the process. These include extensions, source and drain regions, silicide formation, nitride etch stop layers, contact processes, interconnects, etc.

In yet another embodiment of the invention, if the stress level of greater than approximately 3 GPa can be achieved in the channel from the SiGe material, then the SiGe material may be used in both the pFET and the nFET channels. This approach facilitates a large Ge content since it requires an unrelaxed system. Therefore, it is possible to use the SiGe deposition steps described for the pFET. It should be recognized, though, that the process (Ge %) window may be small because of competing needs such as high stress and dislocation issues. Since the stress levels with the channel are relatively reduced compared to the embedded material, the embedded material should have a larger Ge percentage than approximately 25% to 30%, in embodiments, to apply this structure for pFETs. In this approach, there is no independent pFET and nFET control.

Figure 3:
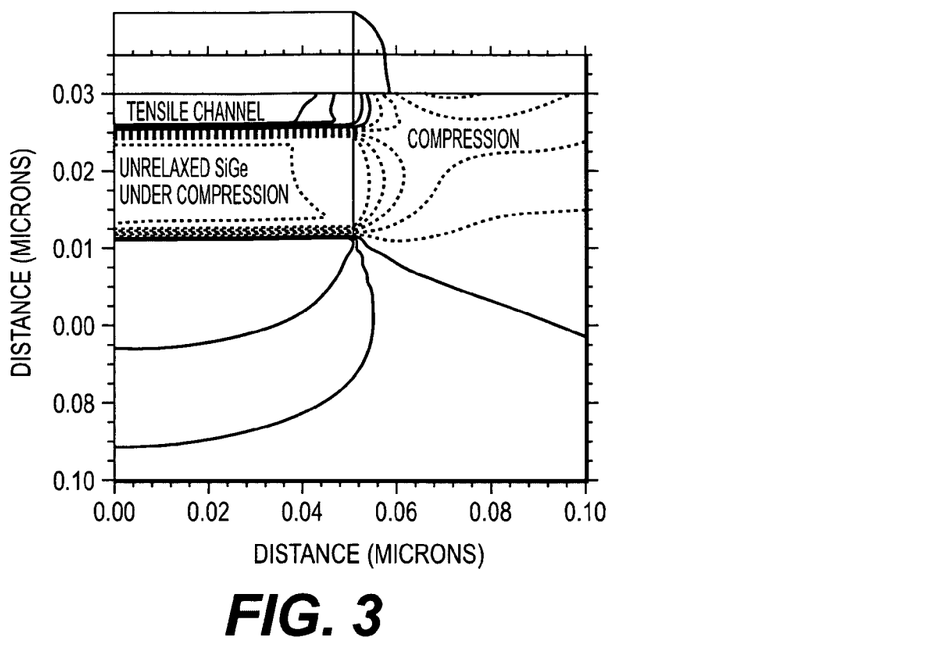
FIG. 3 illustrates the locations of the stresses in an nFET device according to the invention.

FIG. 3 illustrates the locations of the stresses in an nFET device according to the invention. As shown in FIG. 3, tensile stresses are present in the channel of the nFET with a region of unrelaxed SiGe under compression. More specifically, in the structure of the invention, the lattice structure of the SiGe layer 45a matches the lattice structure of the underlying Si insulation layer 20. This results in the SiGe layer 45a and the surrounding areas being under a compressive stress. The surrounding areas will try to obtain an equilibrium state thus resulting in a tensile stress of the epitaxial Si layer 60 formed on the SiGe layer 45a.

Figure 4:
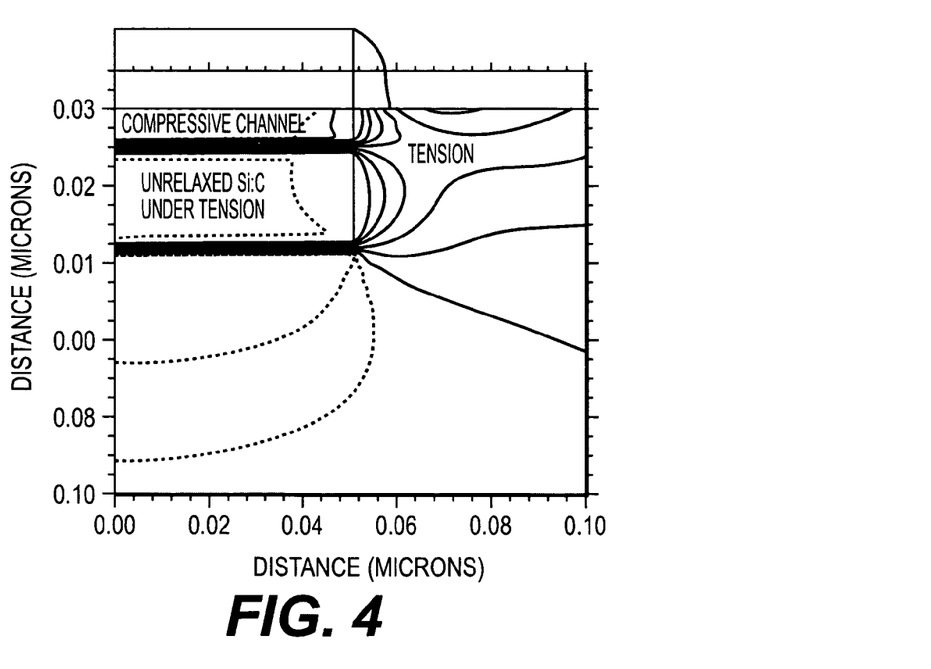
FIG. 4 illustrates the locations of the stresses in a pFET device according to the invention.

FIG. 4 illustrates the locations of the stresses in a pFET device according to the invention. As shown in FIG. 4, compressive stresses are present in the channel of the pFET with a region of unrelaxed Si:C under tension. More specifically, in the structure of the invention, the lattice structure of the Si:C layer 40a will match the lattice structure of the underlying Si insulation layer 20. This results in the Si:C layer 40a and the surrounding areas being under a tensile stress. As in the occurrence with the SiGe layer, the surrounding areas of the Si:C layer 40a will obtain an equilibrium state. This, however, results in a compressive stress of an epitaxial Si layer 60 formed on the Si:C layer 40a.

In one implementation, the preferred range of the longitudinal stress component (stress in direction of current flow from source to drain) in the Si epi 60 of the nFET, of FIG.

$f$, is a tensile value greater than 100 MPa while in the pFET Si channel a compressive value greater than 100 MPa is preferred.

Thus, in the structure of the invention, tensile stresses are now formed in the channel of the nFET and compressive stresses are formed in the pFET. In one implementation, high tensile stresses can also be formed in the pFET. By allowing such stresses, high device performance can be achieved. In addition, with the processes of the invention, the manufacturing costs can be reduced with resulting higher yields.

While the invention has been described in terms of embodiments, those skilled in the art will recognize that the invention can be practiced with modification within the spirit and scope of the appended claims. For example, the invention can be readily applicable to bulk substrates.

What is claimed is:

1. A method of manufacturing a semiconductor structure, comprising the steps of:
    forming, by removing material from an upper surface of a substrate, a p-type field-effect-transistor (pFET) channel and a n-type field-effect- transistor (nFET) channel in a the substrate;
    providing a first layer of material within the pFET channel having a lattice constant different than the lattice constant of the substrate;
    providing a second layer of material within the nFET channel having a lattice constant different than the lattice constant of the substrate, the second layer of material being different from the first layer of material;
    forming an epitaxial semiconductor layer over the first layer of material in the pFET channel and the second layer of material in the nFET channel, the epitaxial semiconductor layer having substantially a same lattice constant as the substrate such that a stress component is created within the pFET channel and the nFET channel.

2. The method of claim 1, wherein the pFET channel and the nFET channel are formed simultaneously.

3. The method of claim 1, wherein the pFET channel and the nFET channel are formed separately.

4. The method of claim 1, wherein the first layer of material is SiGe having a content of Ge approximately greater than 25% in ratio to Si.

5. The method of claim 4, wherein the first layer of material creates a tensile stress within the epitaxial semiconductor layer of greater than 3 GPa.

6. The method of claim 1, wherein the second layer of material is SiGe.

7. The method of claim 6, wherein the second layer of material creates a tensile stress within the epitaxial semiconductor layer within the nFET channel.

8. The method of claim 1, wherein the first layer of material is Si:C.

9. The method of claim 1, further comprising the steps of:
    forming a gate oxide structure over the epitaxial semiconductor layer; and
    forming extensions and a drain region and a source region in the substrate on sides of the gate oxide structure.

10. The method of claim 1, wherein the forming of the nFET and pFET channels includes etching an Si layer of the substrate to approximately a depth of about 200 Å to 400 Å.

11. The method of claim 1, wherein:
    the first layer of material is formed by placing a hard mask over the nFET channel and growing the first layer of material within the pFET channel; and
    the second layer of material is formed by placing a hard mask over the pFET channel and growing the second layer of material within the nFET channel.

12. The method of claim 1, further comprising forming shallow trench structures within the substrate.

13. The method of claim 1, wherein the first layer of material and the second layer of material are grown to a height about 100 Å to 300 Å.

14. The method of claim 1, wherein the substrate is a layer of silicon on insulator.

15. The method of claim 1, wherein the first layer of material and the second layer of material are both SiGe material, having a larger Ge percentage than approximately 25% to 30% to apply for the pFET.

16. A method of manufacturing a semiconductor structure, comprising the steps of:
    forming a p-type field-effect-transistor (pFET) channel and a n-type field-effect-transistor (nFET) channel by etching an upper surface in of a substrate;
    providing a first layer of material within the pFET channel having a lattice constant different than the lattice constant of the substrate;
    providing a second layer of material within the nFET channel having a lattice constant different than the lattice constant of the substrate, the second layer of material being different from the first layer of material; and
    forming an epitaxial semiconductor layer over the first layer of material in the pFET channel and the second layer of material in the nFET channel, the epitaxial semiconductor layer having substantially a same lattice constant as the substrate thus creating a stress component opposite to that of the first layer of material within the pFET channel and the second layer of material within the nFET channel.

17. The method of claim 16, wherein the pFET channel and the nFET channel are formed simultaneously.

18. The method of claim 16, wherein the pFET channel and the nFET channel are formed separately.

19. The method of claim 16, wherein the first layer of material is Si:C and the second layer of material is SiGe.

20. The method of claim 19, wherein:
    the first layer of material creates a compressive stress within the epitaxial semiconductor layer within the pFET channel;
    and the second layer of material creates a tensile stress within the epitaxial semiconductor layer within the nFET channel.

21. The method of claim 16, further comprising the steps of:
    forming a gate oxide structure over the epitaxial semiconductor layer; and
    forming extensions and a drain region and a source region in an Si layer of the substrate on sides of the gate oxide structure.

22. The method of claim 16, wherein:
    the first layer of material is formed by placing a hard mask over the nFET channel and growing the first layer of material within the pFET channel; and the second layer of material is formed by placing a hard mask over the pFET channel and growing the second layer of material within the nFET channel.

23. A method of manufacturing a semiconductor structure, comprising the steps of:

etching in an upper layer of a substrate a p-type field-effect-transistor (pFET) channel and a n-type field-effect-transistor (nFET) channel;

providing a layer of Si:C within the pFET channel having a lattice constant different than the lattice constant of the substrate;

providing a layer of SiGe within the nFET channel having a lattice constant different than the lattice constant of the substrate;

forming an epitaxial semiconductor layer over the layers of Si:C and SiGe in the pFET and the nFET channels, the epitaxial semiconductor layer having substantially a same lattice constant as the substrate such that different stress components are created within the pFET channel and the nFET channel.

* * * * *